United States Patent
Imamura et al.

(10) Patent No.: US 12,072,454 B2
(45) Date of Patent: Aug. 27, 2024

(54) SCINTILLATOR, MEASURING DEVICE, MASS SPECTROMETER, AND ELECTRON MICROSCOPE

(71) Applicant: HITACHI HIGH-TECH CORPORATION, Tokyo (JP)

(72) Inventors: Shin Imamura, Tokyo (JP); Toshiaki Kusunoki, Tokyo (JP); Eri Takahashi, Tokyo (JP); Yoshifumi Sekiguchi, Tokyo (JP); Takayuki Kanda, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 210 days.

(21) Appl. No.: 17/787,617

(22) PCT Filed: Nov. 19, 2020

(86) PCT No.: PCT/JP2020/043186
§ 371 (c)(1),
(2) Date: Jun. 21, 2022

(87) PCT Pub. No.: WO2021/131436
PCT Pub. Date: Jul. 1, 2021

(65) Prior Publication Data
US 2022/0413169 A1 Dec. 29, 2022

(30) Foreign Application Priority Data
Dec. 24, 2019 (JP) .................... 2019-233378

(51) Int. Cl.
*G01T 1/20* (2006.01)
*H01J 49/02* (2006.01)

(52) U.S. Cl.
CPC .......... *G01T 1/2018* (2013.01); *H01J 49/025* (2013.01)

(58) Field of Classification Search
None
See application file for complete search history.

(56) References Cited

U.S. PATENT DOCUMENTS

| | | | |
|---|---|---|---|
| 7,910,895 B2 | 3/2011 | Uchiyama et al. | |
| 11,062,892 B2 * | 7/2021 | Imamura | H01J 37/244 |

(Continued)

FOREIGN PATENT DOCUMENTS

| | | |
|---|---|---|
| JP | 2005298603 A | 10/2005 |
| JP | 2017135039 A | 8/2017 |

OTHER PUBLICATIONS

International Search Report of PCT/JP2020/043186 dated Jan. 19, 2021.

(Continued)

*Primary Examiner* — Edwin C Gunberg
(74) *Attorney, Agent, or Firm* — MATTINGLY & MALUR, PC (57) ABSTRACT

Provided are a scintillator and the like capable of improving emission intensity. A scintillator (S) comprises a sapphire substrate (6), a GaN layer (4) that is provided on the incident side to the sapphire substrate (6) and includes GaN, a quantum well structure (3) provided on the incident side to the GaN layer (4), and a conductive layer (2) provided on the incident side to the quantum well structure (3), wherein a plurality of emitting layers (21) including InGaN and a plurality of barrier layers (22) including GaN are alternatively stacked in the quantum well structure (3), and an oxygen-containing layer (23) including oxygen is provided between the quantum well structure (3) and the conductive layer (2).

12 Claims, 7 Drawing Sheets

(56) References Cited

U.S. PATENT DOCUMENTS

2017/0288102 A1 10/2017 Farrens et al.
2019/0027351 A1 1/2019 Imamura et al.

OTHER PUBLICATIONS

Japanese Office Action received in corresponding Japanese Application No. 2019-233378 dated May 30, 2023.
Higashiwaki, M. et al., "Crystal Growth and Device Application of Gallium Oxide", National Institute of Information and Communications Technology, 2014, pp. 102-107, vol. 35, No. 2.
Extended European Search Report received in corresponding European Application No. 20905041.8 dated Oct. 17, 2023.

* cited by examiner

(a) EXAMPLE 1
(DENSITY OF RECESSED PITS > $10^4$ PITS/cm$^2$)

(b) CONVENTIONAL EXAMPLE
(NUMBER OF RECESSED PITS IS SMALL)

SCINTILLATOR, MEASURING DEVICE, MASS SPECTROMETER, AND ELECTRON MICROSCOPE

TECHNICAL FIELD

The present invention relates to a scintillator, a measuring device, a mass spectrometer, and an electron microscope, and particularly relates to a scintillator including a quantum well structure.

BACKGROUND ART

A measuring device that measures charged particles such as ions and electrons from a sample and obtains information of the sample includes a detector for detecting the charged particles. A mass spectrometer will be mainly described below as an example. In the mass spectrometer, an ionized measurement sample is used, and a mass analysis unit selects a sample having a specific mass. The selected ions are introduced into a detector, and the amount of the ions is detected. Here, as a method of detecting the amount of ions, a detector using a scintillator can be used.

This detector irradiates a conversion dynode with ions selected based on the mass to generate electrons. The generated electrons are made incident on the scintillator of the detector by applying a positive voltage of about 5 kV to 15 kV to the detector.

The scintillator has a structure that emits light in response to incidence of a charged particle beam. Light emitted from the scintillator due to incident electrons is converted into an electric signal by a light receiving element such as a photoelectric tube via a light guide or the like, and the converted electric signal is used as measurement information. Information on the amount of ions is obtained based on the detected intensity of the light emitted. The detector using the scintillator can perform the detection with high sensitivity and high durability.

In recent years, in measurement, demands for expanding a dynamic range, reducing noise, improving throughput, and the like are large, and in order to cope with these demands, it is necessary to shorten a detection time and increase a detection signal. For this purpose, it is necessary to increase the response speed of the scintillator and increase the detection sensitivity.

Here, as a conventional example, a technique for a scintillator having a fast response speed is disclosed in the literature. PTL 1 discloses a scintillator having a light emitter including an InGaN/GaN quantum well layer formed on a substrate. In addition, it describes that on the InGaN/GaN quantum well layer, a cap layer having bandgap energy larger than that of a constituent material of a nitride semiconductor layer including the InGaN/GaN quantum well layer, and a metal back layer made of Al and provided on the cap layer are provided.

PTL 2 describes that a cap layer in which a GaN layer is grown is provided on a multilayer structure in which InGaN and GaN are alternately stacked, and an Al thin film for preventing charging at the time of electron incidence is deposited on the cap layer.

CITATION LIST

Patent Literature

PTL 1: JP 2005-298603 A (corresponding to U.S. Pat. No. 7,910,895)

PTL 2: JP 2017-135039 A

SUMMARY OF INVENTION

Technical Problem

However, the conventional techniques have a problem that the light emission intensity is low.

What is required in a measuring device such as a mass spectrometer is a wide dynamic range in which signals from a weak signal to a strong signal can be evaluated. A characteristic required for a scintillator for this purpose is that light emission intensity is sufficient for light to be separated from noise even when the number of incident electrons is small.

In addition, even in a case where the number of incident electrons is large, it is more preferable that the saturation of the light emission intensity be small and a change in the number of electrons be able to be measured.

As characteristics of the scintillator, it is necessary to generate sufficiently strong light emission at the time of electron incidence. Further, it is more preferable that light emitted almost disappear before the next incidence.

In a conventional light emitter including an InGaN/GaN quantum well layer, the efficiency of converting incident electrons into light is limited, and the light emission intensity is low. In addition, electrons incident on the scintillator have negative charges. When such electrons remain in the scintillator, the electrons repel the subsequently incident electrons, and the amount of electrons to be incident is reduced. In addition, some of such residual electrons cause the scintillator to emit light slightly after being incident on the scintillator, which causes a decrease in response speed.

The inventors have found that, in each of the scintillators described in PTL 1 and PTL 2, the crystal structure of the quantum well layer cannot efficiently convert incident electrons into light emission in the quantum well layer. In addition, it has been found that electrons remaining in the scintillators cannot be controlled in the conventional structures. Therefore, when the conventional techniques are used, the light emission output is weak, and sufficient characteristics cannot be obtained.

Therefore, the present invention has been made to solve such problems, and provides a scintillator or the like capable of improving light emission intensity.

It should be noted that some examples of the present invention achieve faster response or a wider dynamic range.

Solution to Problem

An example of a scintillator according to the present invention includes:
a substrate;
a GaN layer provided on an incident side with respect to the substrate and containing GaN;
a quantum well structure provided on the incident side with respect to the GaN layer; and
a conductive layer provided on the incident side with respect to the quantum well structure,
in which
in the quantum well structure, a plurality of light emitting layers containing InGaN and a plurality of barrier layers containing GaN are alternately stacked, and
an oxygen-containing layer containing oxygen is provided between the quantum well structure and the conductive layer.

An example of a measuring device according to the present invention is a charged particle beam device including a detector that detects charged particles obtained based on irradiation with a charged particle beam emitted from a charged particle source, in which the detector is the above-described scintillator.

An example of a mass spectrometer according to the present invention is a mass spectrometer including a detector that detects mass-separated ions, in which the detector is the above-described scintillator.

An example of an electron microscope according to the present invention is an electron microscope including a detector that detects an electron beam emitted from an evaluation target, in which the detector is the above-described scintillator.

The present specification includes the disclosure of Japanese Patent Application No. 2019-233378 on which priority of the present application is based.

Advantageous Effects of Invention

According to the scintillator and the like according to the present invention, it is possible to cause the scintillator to efficiently emit light using charged particles to be incident and improve the light emission intensity of the scintillator.

DESCRIPTION OF EMBODIMENTS

Hereinafter, embodiments of the present invention will be described with reference to the accompanying drawings.

Example 1

Example 1 relates to a mass spectrometer including a detector using a scintillator as a detection element. However, the application of the present invention is not limited to Example 1. The mass spectrometer is an example of a measuring device, and the scintillator of Example 1 can be used for other measuring devices. As an example of another measuring device, the scintillator of Example 1 may be used for an electron microscope using an electron beam, may be used for a semiconductor pattern measuring device using a scanning electron microscope, may be used for an inspection device, or may be used for an observation device.

The scintillator in the present specification refers to an element that emits light in response to incidence of a charged particle beam. The scintillator herein is not limited to that shown in Example 1, and may have various shapes or structures.

Figure 1:
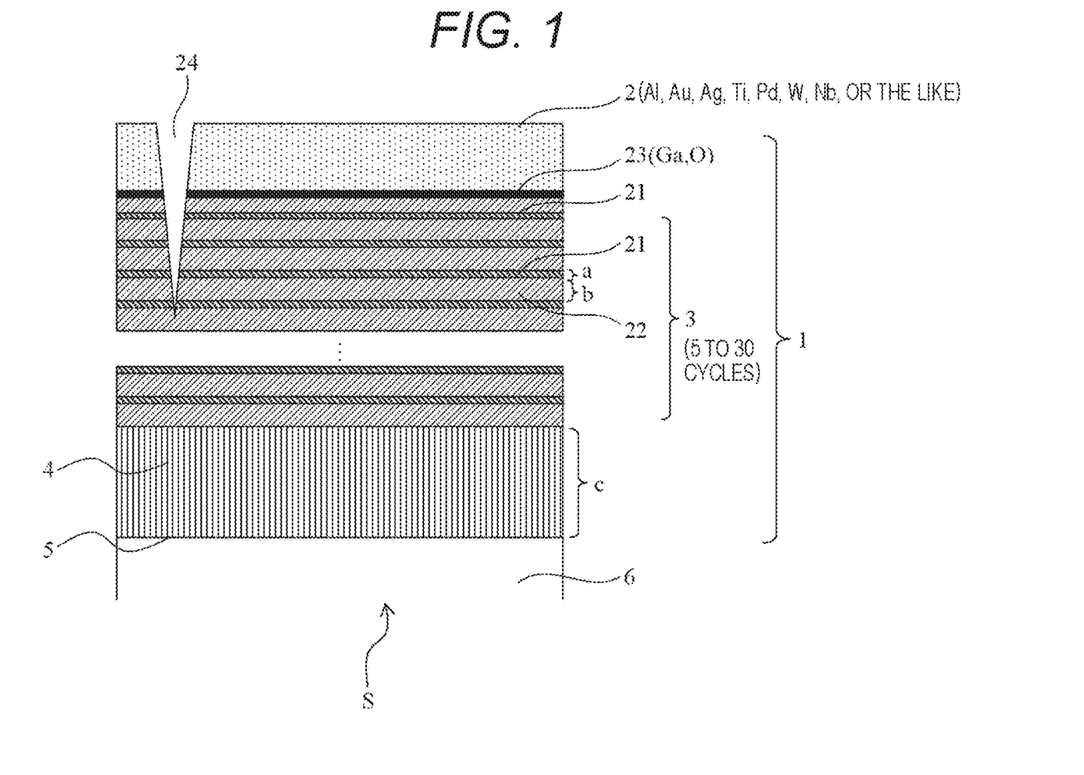
FIG. 1 is a diagram showing a configuration of a scintillator according to Example 1 of the present invention.

A specific configuration of the scintillator according to Example 1 will be described below. FIG. 1 is a diagram showing a configuration of a scintillator S of Example 1, and particularly includes a schematic diagram showing a configuration of a light emitting unit 1. A light emitting element including a quantum well structure 3 containing GaN is used for the light emitting unit 1.

The scintillator S includes a substrate. The substrate can be, for example, a sapphire substrate 6. In addition, the scintillator S includes a GaN layer 4. The GaN layer 4 is a layer containing GaN, and functions as a buffer layer.

The GaN layer 4 is provided on the incident side with respect to the sapphire substrate 6. In the present specification, the "incident side" refers to the side on which a surface on which charged particles to be detected are incident is located in the scintillator S or in a specific layer included in the scintillator S. A surface located on the incident side may also be referred to as an "upper surface". In Example 1, it can also be said that the GaN layer 4 is stacked on the upper surface of the sapphire substrate 6.

The scintillator S has a quantum well structure 3. The quantum well structure 3 is provided on the incident side with respect to the GaN layer 4. In the quantum well structure 3, a plurality of light emitting layers 21 and a plurality of barrier layers 22 are alternately stacked. The light emitting layers 21 contain InGaN, and the barrier layers 22 contain GaN. Each of the light emitting layers 21 also functions as a quantum well layer.

The scintillator S includes a conductive layer 2. The conductive layer 2 is provided on the incident side with respect to the quantum well structure 3. In addition, the scintillator S includes an oxygen-containing layer 23. The oxygen-containing layer 23 is provided between the quantum well structure 3 and the conductive layer 2 (for example, at an interface therebetween).

Examples of a more specific configuration, composition, and preparation method of such a scintillator S will be described. However, the configuration, the composition, and the preparation method are not limited to those described below, and any configuration, any composition, and any preparation method can be employed as long as the above configuration can be made.

First, the GaN layer 4 is grown on the sapphire substrate 6, and a large number of light emitting layers 21 containing $Ga_{1-x}In_xN$ (where $0<x<1$) are grown above the GaN layer 4 while changing the composition, thereby forming the quantum well structure 3. The conductive layer 2 is directly formed on the quantum well structure 3. The conductive layer 2 is a layer formed on the most incident side of the scintillator S.

The entire conductive layer 2 is made of, for example, Al, but is not limited thereto. For example, the conductive layer 2 contains at least one of Al, Au, Ag, Ti, Pd, W, and Nb.

When these materials are used, the scintillator S having good characteristics can be configured.

The sapphire substrate 6 had a disk shape with a diameter of 2 inches (about 5.1 cm), and the GaN layer 4 was grown so that the thickness c was in a range of 3 to 10 µm.

In the quantum well structure 3, a light emitting layer 21 having a composition of $Ga_{1-x}In_xN$ and a barrier layer 22 having a composition of GaN are alternately overlapped in a plurality of cycles, and the number of cycles is in a range of 2 to 40. The thickness of the quantum well structure 3 is in a range of 20 nm to 2000 nm. An Al layer as the conductive layer 2 was formed on the incident side with respect to the quantum well structure 3 by vapor deposition and had a thickness in a range of 40 to 1000 nm. The conductive layer 2 has an antistatic action at the time of electron incidence.

The oxygen-containing layer 23 containing oxygen was provided between the conductive layer 2 and the quantum well structure 3. In addition, in the scintillator S according to Example 1, a recessed pit 24 expanding toward the incident side is formed from the quantum well structure 3 to the conductive layer 2. This pit 24 occurs, for example, as a result of crystal strain or a crystal defect. Since the scintillator S includes the plurality of light emitting layers 21, the pit 24 does not necessarily exist over all the light emitting layers 21, but a plurality of pits 24 are formed in at least the light emitting layer 21 provided on the most incident side.

The plurality of light emitting layers 21 may all have the same thickness and the same composition, or may have different thicknesses or different compositions. The plurality of barrier layers 22 may all have the same thickness and the same composition, or may have different thicknesses or different compositions.

In addition, an interface 5 between the light emitting unit 1 and the sapphire substrate 6 may be a flat surface or may have an uneven structure. For example, when a structure in which a protruding structure having a structural pitch within a range of 10 to 10000 nm and a structural height within a range of 10 to 10000 nm is continuously formed is formed, it is effective to improve the light emission output by extracting emitted light.

A portion cut out from such a structure into a predetermined size was used as the scintillator S.

Figure 2:
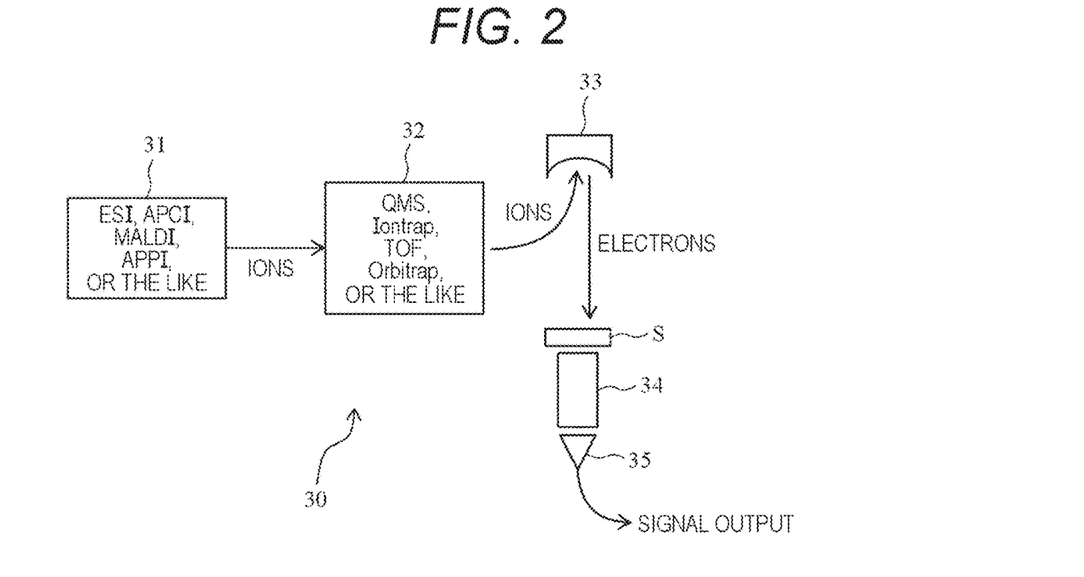
FIG. 2 is a diagram showing a basic configuration of a mass spectrometer including the scintillator shown in FIG. 1.

FIG. 2 is a diagram showing a basic configuration of a mass spectrometer 30 according to Example 1. The mass spectrometer 30 performs mass separation of ions by an electromagnetic action, and measures a mass-to-charge ratio of ions to be measured. The mass spectrometer 30 includes an ion source 31, a mass separation unit 32, a conversion dynode 33 (conversion electrode), an amplifier 34, and a signal output unit 35.

The ion source 31 can adopt a method such as ESI, APCI, MALDI, or APPI. Examples of the mass separation unit 32 include a QMS type, an iontrap type, a time-of-flight (TOF) type, an FT-ICR type, an Orbitrap type, and a composite type thereof.

The mass spectrometer 30 causes ions mass-selected by the mass separation unit 32 to collide with the conversion dynode 33 to be converted into charged particles, detects the generated charged particles by the scintillator S, and converts emitted light into a signal output by the amplifier 34 and the signal output unit 35.

Figure 3:
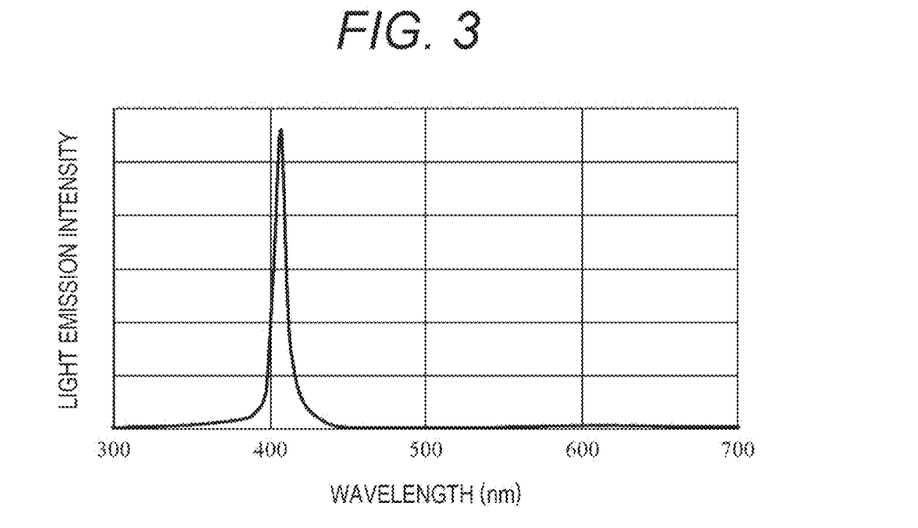
FIG. 3 is a diagram showing an example of an emission spectrum of the scintillator shown in FIG. 1.

FIG. 3 shows an example of an emission spectrum of the scintillator S.

Figure 4:
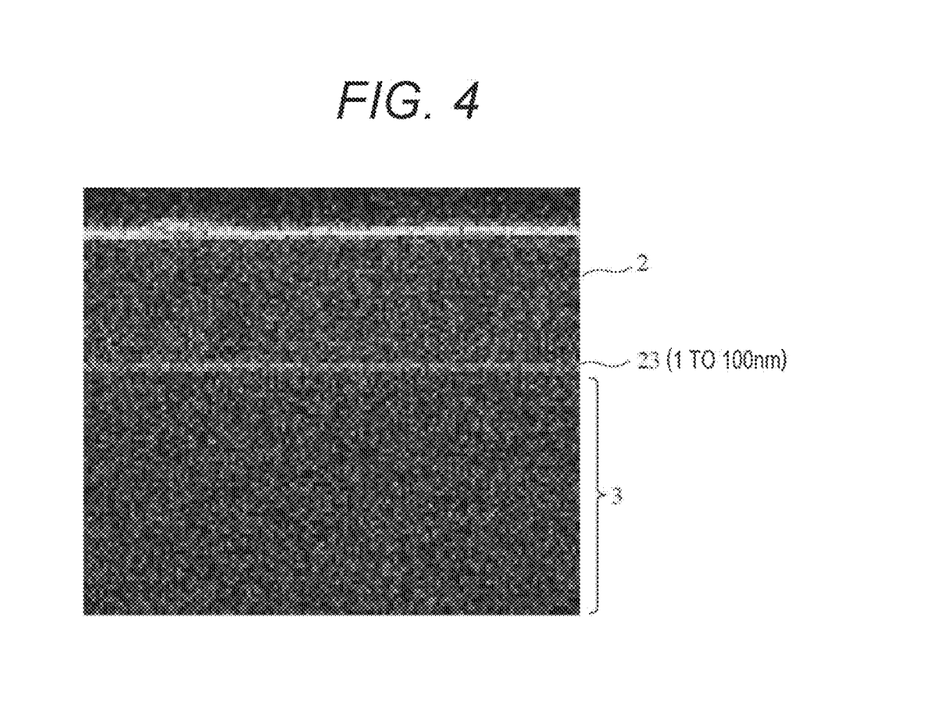
FIG. 4 is a diagram showing an oxygen composition distribution in a cross section of the scintillator shown in FIG. 1.

In the scintillator S of Example 1, the oxygen-containing layer 23 is disposed between the conductive layer 2 and the quantum well structure 3. FIG. 4 is a diagram showing an oxygen composition distribution in a cross section of the scintillator S. In this diagram, the oxygen-containing layer 23 is shown between the conductive layer 2 and the quantum well structure 3.

The oxygen-containing layer 23 may contain an oxide of Ga. By containing the oxide of Ga, the characteristics of the scintillator S may be easily controlled. In addition, the oxygen-containing layer 23 may contain an oxide having a composition (Al in the present Example) constituting the conductive layer 2.

The oxygen-containing layer 23 can be formed by exposing the quantum well structure 3 to a gas containing oxygen after growing the quantum well structure 3. In addition, it is also possible to perform the formation by performing heating in a gas containing oxygen. The thickness of the oxygen-containing layer 23 is arbitrary, but when the thickness is in a range of 1 nm to 100 nm, the resistance value between the conductive layer 2 and the quantum well structure 3 can be appropriately controlled.

Light emission of the scintillator S occurs when electrons incident on the quantum well structure 3 apply energy to excite carriers. When the incident electrons remain in the quantum well structure 3, the excitation continuously occurs, and the light emission intensity increases. In addition, in a case where the incident electrons are immediately removed from the quantum well structure 3, the continuation of excitation is short, and the light emission intensity decreases. However, in that case, there is an advantage that the light emission ends in a short time and the response time is shortened.

Figure 5:
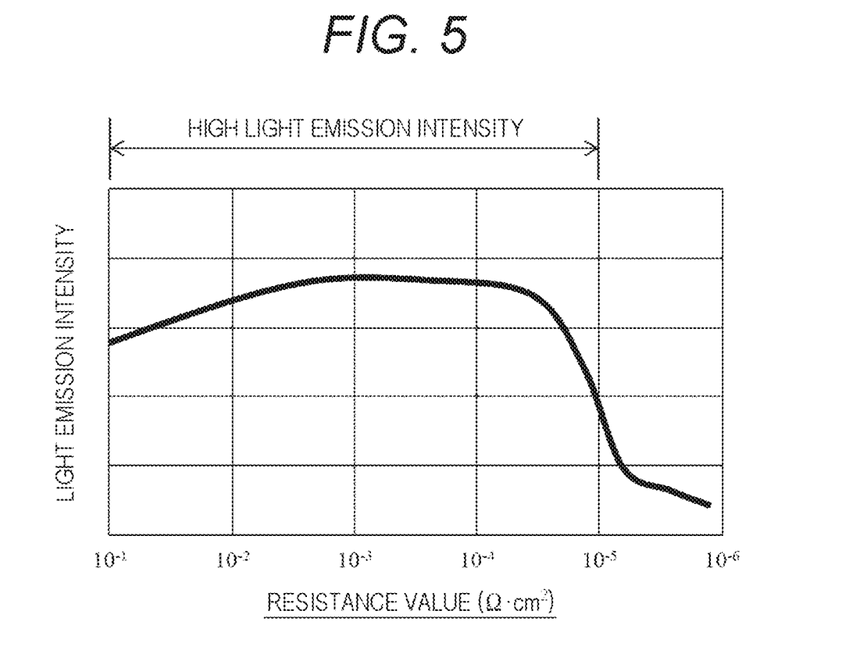
FIG. 5 is a diagram showing a relationship between electrical resistance between a conductive layer and a quantum well structure and light emission intensity in the scintillator shown in FIG. 1.

FIG. 5 shows a relationship between electrical resistance between the conductive layer 2 and the quantum well structure 3 and the light emission intensity in the scintillator S. Note that FIG. 5 shows the results of comparing the light emission intensities under various conditions, and the light emission intensity (vertical axis) is not particularly given a unit. Hereinafter, the same applies to the other drawings.

In the scintillator S, the light emission intensity and the response time can be adjusted by controlling the resistance between the conductive layer 2 and the quantum well structure 3. For example, it has been found that when the resistance value between the conductive layer 2 and the quantum well structure 3, that is, the surface resistance is in a range of $10^{-1}$ to $10^{-5}$ $\Omega cm^2$, good light emission intensity can be obtained. When the surface resistance is within this range, the response time may be within a sufficiently usable range.

Figure 6:
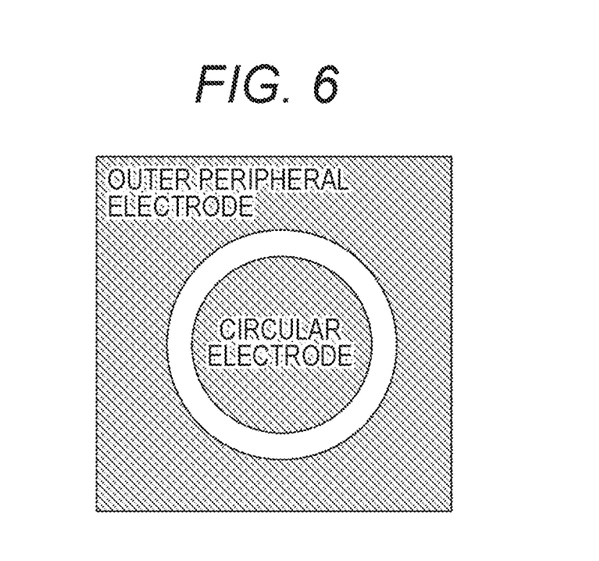
FIG. 6 is a schematic diagram of a method for measuring a resistance value of a thin film.

Here, for the evaluation of the electrical resistance between the conductive layer 2 and the quantum well structure 3, a generally used thin film resistance value measuring means was used. As an example, FIG. 6 shows an example of a method for measuring the resistance value (a method by forming a circular electrode). A means for evaluating a minute current with an ammeter capable of measuring the minute current using such a circular electrode can be used. FIG. 6 shows the shape of an electrode formed on the surface of a measurement sample, and a resistance value can be evaluated by measuring the resistance between a circular electrode and an outer peripheral electrode.

In addition, the following method was also performed as control of the light emission intensity and the response time. As one of the configurations of the present Example, the light emitting layer 21 can be disposed immediately below the conductive layer 2 (Al layer). Here, the expression "immediately below" means a positional relationship in which the barrier layers 22 are not sandwiched, and the presence or absence of the oxygen-containing layer 23 is ignored.

In this case, the light emitting layer 21 in contact with the conductive layer 2 has a composition of $Ga_{1-y}In_yN$ (where $0<y<1$) and has band gap energy smaller than that of GaN. Since this layer contains In, the conductivity is higher than that of the GaN layer 4, and the band gap is small, so that electrons easily flow. Therefore, electrons incident on the quantum well structure 3 can immediately move to the conductive layer 2. The conductive layer 2 is made of a conductor (for example, Al), and electrons are removed without staying in the light emitting unit 1. This is effective when the response time is adjusted to be short.

Here, when the electrons incident on the quantum well structure 3 are not immediately removed, the remaining electrons become negative charges, and act as a repulsive force to electrons incident thereafter, so that the amount of incident electrons decreases, leading to a decrease in the light emission output. In addition, some of the remaining electrons cause delayed light emission, in which light is emitted after a short period of time after being incident, which causes impairment of the high-speed light emission. With respect to such a problem, according to Example 1, since electrons after incidence are immediately removed, it is possible to increase the light emission output and the speed of light emission.

As one modification of the present Example, the barrier layer 22 may be placed at a position immediately below the conductive layer 2, instead of the light emitting layer 21.

Figure 7:
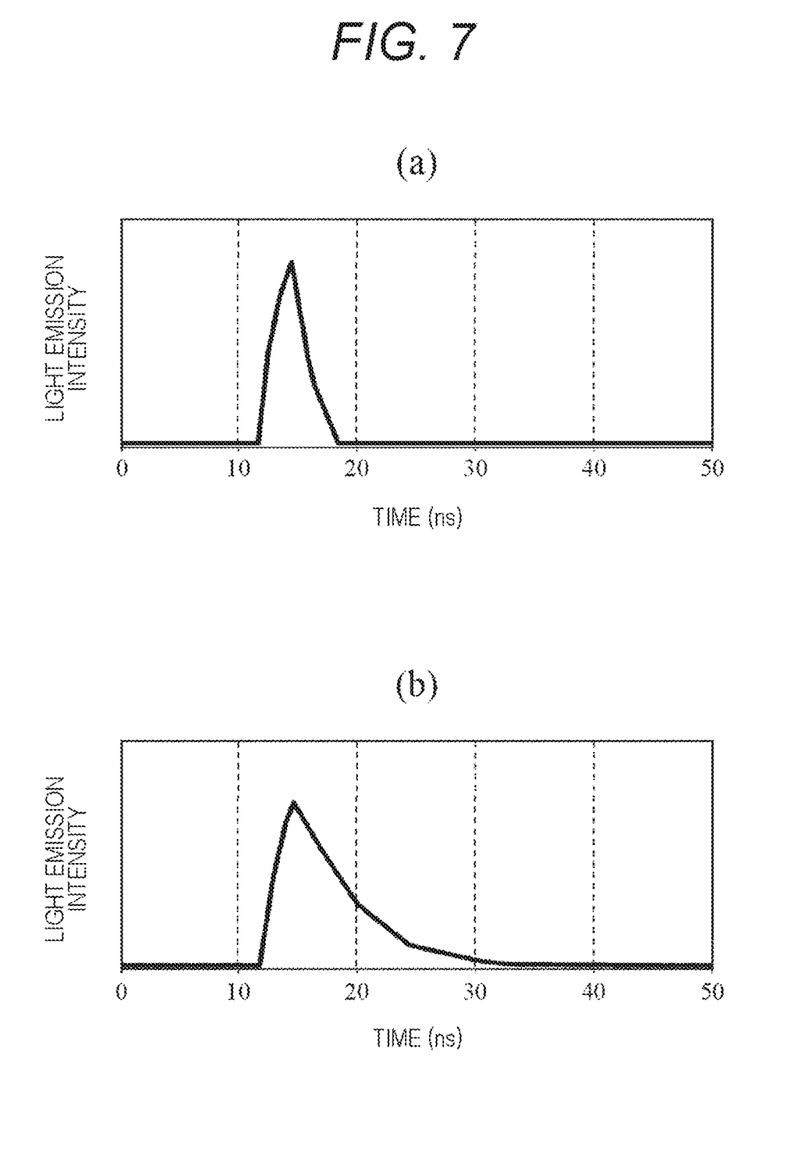
FIG. 7 is a diagram showing a change in the light emission intensity with respect to a change in time in the quantum well layer.

FIG. 7 shows a change in the light emission intensity with respect to a change in time in the light emitting layers 21. This is a result of evaluating a change in the light emission output after electrons are incident on the light emitting layers 21 at an extremely high speed in units of ns. FIG. 7(a) is a diagram showing a change in the light emission intensity with respect to a change in time in a case of using a structure in which the conductive layer 2 (Al in this example) is in direct contact with the light emitting layer 21. On the other hand, FIG. 7(b) is a diagram showing a change in the light emission intensity in a case where a layer (for example, a layer containing GaN or the barrier layer 22 as an example) having a large band gap is formed on the light emitting layer 21 and the conductive layer 2 is formed on the layer. Here as well, the presence or absence of the oxygen-containing layer 23 is ignored for the expression "direct contact".

In FIG. 7(b), it can be seen that emitted light remains over several tens of ns after the light emission rises. This is because remaining electrons cause delayed light emission of several tens of ns. Such light emission impairs the fast response and degrades the properties of the device. On the other hand, in FIG. 7(a), it can be seen that emitted light disappears in 10 ns or less after the light emission rises. This is because remaining electrons are immediately removed.

As shown in FIG. 1, the scintillator S of Example 1 has the recessed pits 24 generated from the quantum well structure 3 to the conductive layer 2. By controlling the area density of the pits 24 in the surface of the light emitting unit 1 within a range of $10^4$ pits/cm² or more and $10^{10}$ pits/cm² or less, good light emission characteristics can be obtained.

The area density of the pits 24 can be controlled by adjusting the temperature, the growth rate, the composition, the raw material, and the like at the time of crystal growth. In the light emission in the quantum well structure 3, electrons and pits, which are carriers generated by excitation, are confined in the light emitting layers 21, and the electrons and the pits are easily efficiently combined, so that the light emission is performed with high efficiency. As a result of studies by the inventors, it has been found that it is better to introduce crystal strain to the crystal to some extent in order to further increase this light emission. This is a result that can be known only by actually conducting experiments with crystals in various states, unlike the general idea that improving a crystal and reducing strain improve the efficiency.

The reason why the light emission intensity increases due to the presence of crystal strain is not strictly specified, but what is considered as an example will be described below. The recessed pits 24 generated by the strain are voids in a part of the inside of the quantum well structure 3. The periphery forms a wall of a crystal with large strain. The quantum well structure 3 is a structure in which carriers are confined in a two-dimensional structure, and the light emission efficiency is improved by the confinement. It is considered that when the crystal wall is added thereto, localization or bending of the energy band occurs around the crystal wall, and localization of carriers also occurs around the crystal wall. Therefore, it can be considered that carrier confinement further occurs in a one-dimensional structure, and the light emission efficiency is increased. When the number of recessed pits increases to some extent or more, the amount of crystals to emit light may decrease, and conversely, the amount of emitted light may decrease.

Figure 8:
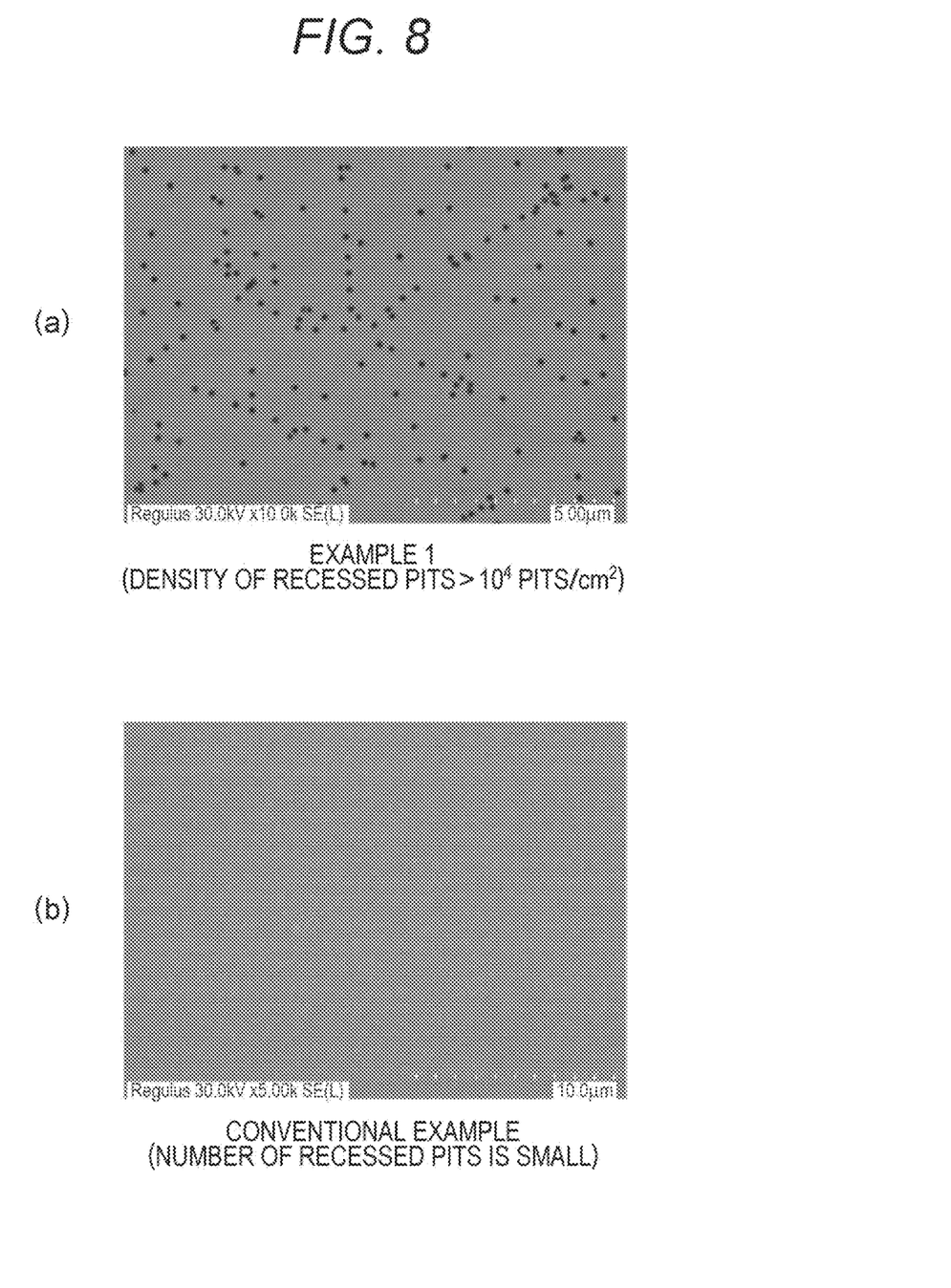
FIG. 8 is a diagram for comparing differences in area density of recessed pits in the surface of the scintillator.

FIG. 8 is a diagram for comparing differences in area density of recessed pits 24 in the surface of the scintillator. FIG. 8(a) is a diagram of the scintillator S of Example 1, and FIG. 8(b) is a diagram of a conventional scintillator.

Figure 9:
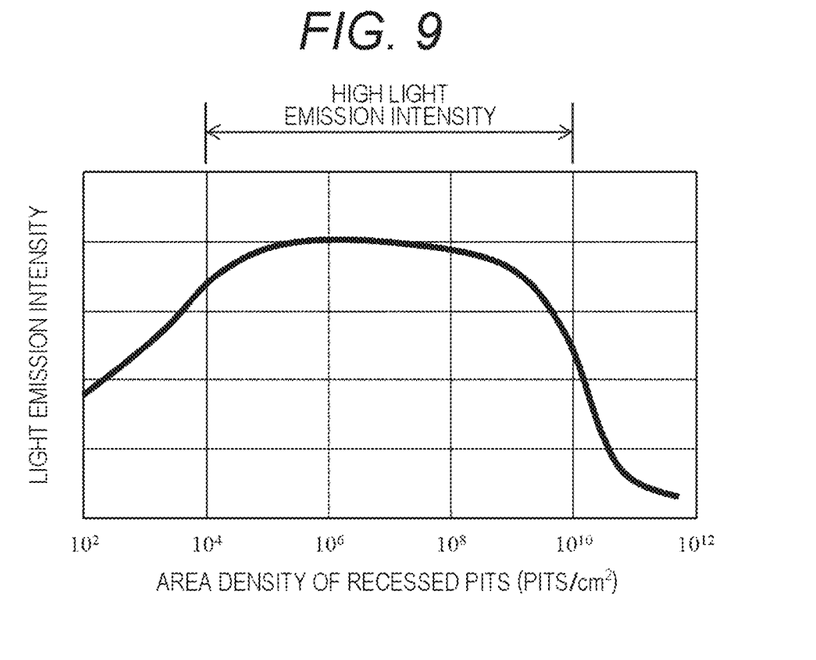
FIG. 9 is a diagram showing differences in light emission intensity for area densities of recessed pits of the scintillator.

In addition, FIG. 9 shows differences in light emission intensity for different area densities of the recessed pits 24. It is shown that when the area density of the pits 24 is high to some extent and is within the range of $10^4$ pits/cm² or more and $10^{10}$ pits/cm² or less, the light emission intensity increases. As described above, by using a crystal having a recessed pit having an appropriate area density, a scintillator having good characteristics can be manufactured.

The layer thickness of the quantum well structure 3 will be described below. It is more desirable that the scintillator S of Example 1 be prepared under the following conditions for the thickness of each layer. In order to find more suitable conditions, a large number of scintillators were prepared, and in each scintillator, the ratio b/a of the thickness b of the barrier layer 22 to the thickness a of the light emitting layer 21 shown in FIG. 1 varied. Regarding preparation ranges, b/a is in a range of 1.5 to 20 and the thickness a of each of the light emitting layers 21 is in a range of 1 to 5 nm.

In each of the light emitting layers 21, when the thickness is 4 nm or less, it is generally expected that the quantum effect increases, the light emission wavelength is shifted to a shorter wavelength, and the light emission efficiency is increased. However, in this case, if the thickness of each of the barrier layers 22 is too small, the crystallinity may decrease and the light emission intensity may decrease. In addition, when the thickness of the quantum well structure 3 is too small compared to the penetration distance of the electron beam, the electron beam may not be sufficiently used, and the light emission intensity may decrease. In consideration of these effects, the present inventors have newly found the ranges when the light emission intensity is highest.

Figure 10:
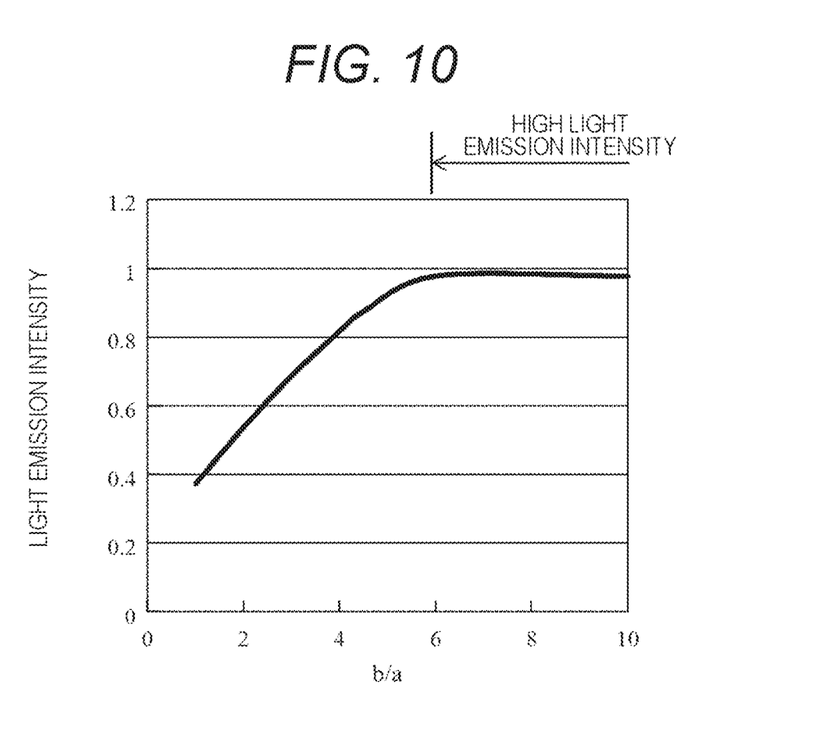
FIG. 10 is a diagram showing a relationship between a ratio of thicknesses of a barrier layer and a light emitting layer and the light emission intensity.

FIG. 10 shows a relationship between the ratio b/a of the thickness b of the barrier layer 22 to the thickness a of the light emitting layer 21, and the light emission intensity. From this diagram, it was found that the light emission intensity increased until the ratio b/a was about 5, but the light emission intensity was almost maximized when the ratio b/a was 6 or more. That is, by setting the ratio b/a to 6 or more, it is possible to manufacture a scintillator that achieves both high light emission intensity and high-speed response.

Note that the scintillator S of Example 1 includes the plurality of light emitting layers 21 and the plurality of barrier layers 22, and the ratio b/a is preferably 6 or more for all of the sets of the light emitting layers 21 and the barrier layers 22 adjacent to each other, but the ratio b/a may not be 6 or more. For example, when b/a 6 is satisfied for the thickness a of any one of the light emitting layers 21 and the thickness b of any one of the barrier layers 22, the above effect can be obtained for that portion.

According to a scintillator that achieves both high light emission intensity and high-speed response, it is possible to support high-speed scanning, and it is possible to provide a charged particle beam device capable of having a sufficient S/N ratio even by high-speed scanning.

Figure 11:
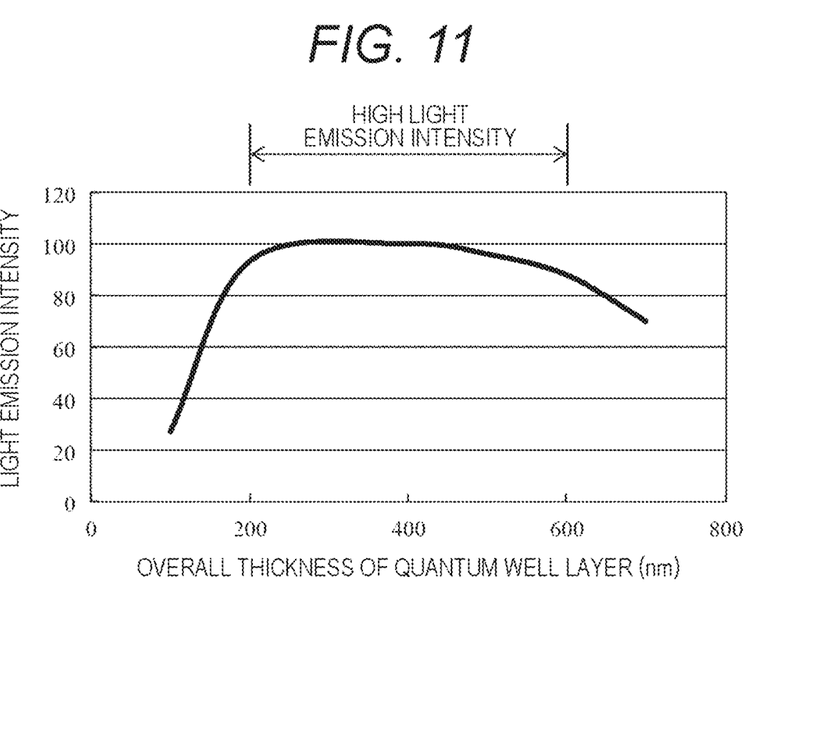
FIG. 11 is a diagram showing a change in the light emission intensity with respect to the overall thickness in the quantum well layer.

In addition, the following effects are obtained in the relationship between the number of light emitting layers 21 and the overall thickness of the quantum well structure 3. FIG. 11 shows a change in the light emission intensity with respect to the overall thickness of the quantum well structure 3 in the present Example.

This diagram shows an example of a case where an electron beam accelerated at 10 kV is radiated as a charged particle beam. It is found that the light emission intensity is maximized when the overall thickness of the quantum well structure 3 is in a range of 200 nm to 600 nm. Furthermore, it has been found that, in a case where an electron beam accelerated by 10 kV was used, even when the number of light emitting layers 21 was changed within a range of 5 to 30 layers, almost the same characteristics were obtained as the relationship between the layer thickness and the light emission intensity. This indicates that the effect of the overall thickness of the quantum well structure 3 is large on the change in the light emission intensity, and the influence is small even when the number of light emitting layers 21 is changed to some extent.

In addition, it has been found that the relationship between the overall thickness of the quantum well structure 3 and the light emission intensity changed depending on the acceleration voltage of the charged particle beam to be radiated. The distance by which the charged particle beam enters the irradiated substance varies depending on the acceleration voltage. The penetration distance of the electron beam accelerated by 10 kV is about 1 μm in the present Example. From this, it is found that the light emission intensity depends on the depth to which the electron beam emits light, and the thickness of the quantum well structure 3 in which light is emitted may be within a range of ⅕ or more and ⅗ or less of the penetration distance of the electron beam.

In addition, when the number of light emitting layers 21 is small, the disturbance of the constituent crystal is reduced, and crystal defects that cause unnecessary light emission are reduced, which is advantageous for light emission characteristics in that respect. Here, it is shown that when the thickness of the quantum well structure 3 is in a range of ½ or more of the penetration distance of the charged particle beam, the number of light emitting layers 21 is freely set to some extent, but when the number of light emitting layers 21 is reduced within a certain range, light emission characteristics are better. According to the study of the present inventors, it was found that when the number of light emitting layers 21 was within the range of 5 to 30, good light emission characteristics were able to be obtained.

According to the research of the present inventors, it has been found that the characteristics were stabilized by appropriately designing the thicknesses of the uppermost layer of the quantum well structure 3 and an upper portion thereof in the scintillator S. For example, when the total thickness of a portion including (the oxygen-containing layer 23, optionally the barrier layers 22) the conductive layer 2 to the light emitting layer 21 provided on the most incident side in the quantum well structure 3 is 200 nm or more, the characteristics are stabilized. When the thickness is 100 nm or less, the characteristics fluctuate, and when the thickness is 100 nm or more, the fluctuation decreases. When the thickness is 200 nm or more, the characteristics become a usable level.

As described above, according to the scintillator S according to Example 1, the light emission intensity can be improved.

The scintillator S of Example 1 is provided in the mass spectrometer, and is used as the detector that detects mass-separated ions. As a modification, the scintillator S can also be used in another measuring device.

Figure 12:
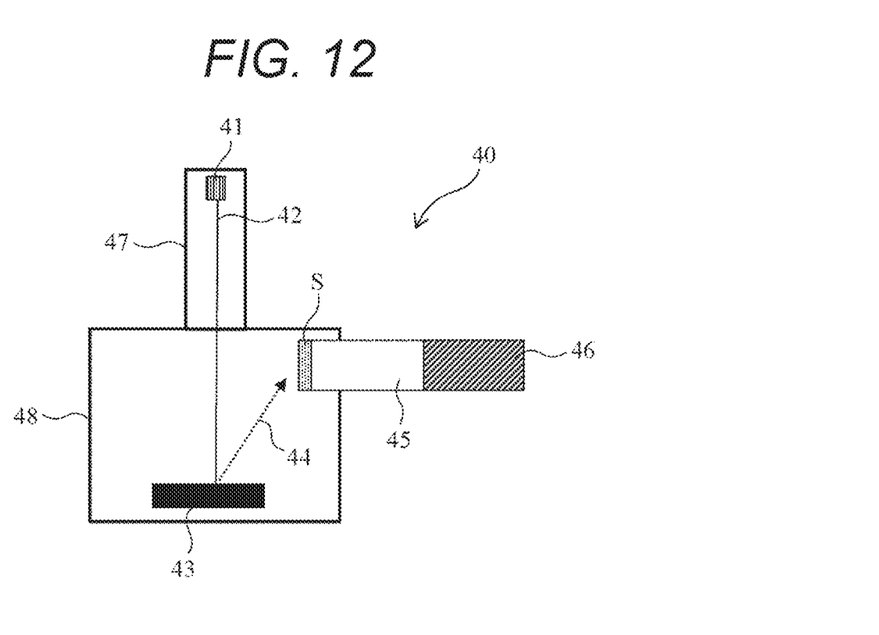
FIG. 12 is a diagram showing a basic configuration of an electron microscope according to a modification of Example 1.

FIG. 12 is a diagram showing a basic configuration of an electron microscope 40 according to the modification. A sample 43 is irradiated with a primary electron beam 42 emitted from an electron source 41, and secondary particles 44 such as secondary electrons or reflected electrons are emitted. The secondary particles 44 are drawn and made incident on the scintillator S. The scintillator S is used as a detector that detects an electron beam emitted from an evaluation target (for example, the sample 43) in the electron microscope 40.

When the secondary particles 44 are incident on the scintillator S, light is emitted in the scintillator S. The light emitted from the scintillator S is guided by a light guide 45 and converted into an electric signal by a light receiving element 46. The scintillator S, the light guide 45, and the light receiving element 46 are collectively referred to as a detection system.

The signal obtained by the light receiving element 46 is converted into an image in association with a position irradiated with the electron beam, and the image is displayed. The electron microscope 40 includes an electron optical system (that is, a deflector, a lens, a diaphragm, an objective lens, and the like) for focusing the primary electron beam 42 on the sample 43 and irradiating the sample 43 with the primary electron beam 42, but this is not shown.

The electron optical system is installed in an electron-optical lens barrel 47. In addition, the sample 43 is placed on a sample stage so as to be movable, and the sample 43 and the sample stage are disposed in a sample chamber 48. The sample chamber 48 is generally kept in a vacuum state at the time of electron beam irradiation.

In addition, although not particularly shown, the electron microscope 40 is connected to a control unit that controls the operation of the whole and each component, a display unit that displays an image, an input unit for the user to input an instruction to operate the electron microscope, and the like.

The electron microscope 40 is an example of a configuration of an electron microscope, and may have another configuration as long as the electron microscope 40 is an electron microscope including a scintillator, a light guide, and a light receiving element. In addition, the secondary particles 44 also include transmitted electrons, scanning transmitted electrons, and the like. Although only one detector (scintillator S) is shown for simplicity, a detector for detecting reflected electrons and a detector for detecting secondary electrons may be separately provided. Further, a plurality of detectors may be provided for discriminating and detecting the azimuth angle or the elevation angle.

As another modification of Example 1, another charged particle beam device may be configured. In such a charged particle beam device, the scintillator S is used as a detector that detects charged particles obtained based on irradiation with a charged particle beam emitted from a charged particle source.

REFERENCE SIGNS LIST 1 light emitting unit
2 conductive layer
3 quantum well structure
4 GaN layer
5 interface
6 sapphire substrate
21 light emitting layer
22 barrier layer
23 oxygen-containing layer
24 pit
30 mass spectrometer
31 ion source
32 mass separation unit
33 conversion dynode
34 amplifier
35 signal output unit
40 electron microscope
41 electron source
42 primary electron beam
43 sample
44 secondary particle
45 light guide
46 light receiving element
47 electro-optical lens barrel
48 sample chamber
S scintillator
a, b, c thickness All publications, patents, and patent applications cited herein are hereby incorporated by reference in their entirety.

The invention claimed is:

1. A scintillator comprising:
a substrate;
a GaN layer provided on an incident side with respect to the substrate and containing GaN;
a quantum well structure provided on the incident side with respect to the GaN layer; and
a conductive layer provided on the incident side with respect to the quantum well structure,
wherein in the quantum well structure, a plurality of light emitting layers containing InGaN and a plurality of barrier layers containing GaN are alternately stacked, and
wherein an oxygen-containing layer containing oxygen is disposed between a barrier layer containing GaN of the quantum well structure and the conductive layer.

2. The scintillator according to claim 1, wherein the oxygen-containing layer contains an oxide of Ga.

3. The scintillator according to claim 1, wherein the oxygen-containing layer has a thickness in a range of 1 nm to 100 nm.

4. The scintillator according to claim 1, wherein surface resistance between the conductive layer and the quantum well structure is in a range of $10^{-1}$ to $10^{-5}$ $\Omega cm^2$.

5. The scintillator according to claim 1, wherein in the quantum well structure, a plurality of recessed pits are formed in at least a light emitting layer provided on a most incident side among the light emitting layers, and
wherein a density of the pits is in a range of $10^4$ pits/cm$^2$ or more and $10^{10}$ pits/cm$^2$ or less.

6. The scintillator according to claim 1, wherein a total thickness of a portion from the conductive layer to the light emitting layer provided on a most incident side in the quantum well structure is 200 nm or more.

7. The scintillator according to claim 1, wherein the conductive layer contains at least one of Al, Au, Ag, Ti, Pd, W, and Nb.

8. The scintillator according to claim 1, wherein a thickness a of any one of the light emitting layers and a thickness b of any one of the barrier layers satisfy b/a≥6.

9. The scintillator according to claim 1, wherein the number of light emitting layers is in a range of 5 to 30.

10. A measuring device that is a charged particle beam device comprising a detector that detects charged particles obtained based on irradiation with a charged particle beam emitted from a charged particle source, wherein the detector is the scintillator according to claim 1.

11. A mass spectrometer comprising a detector that detects mass-separated ions, wherein the detector is the scintillator according to claim 1.

12. An electron microscope comprising a detector that detects an electron beam emitted from an evaluation target, wherein the detector is the scintillator according to claim 1.

* * * * *